(12) United States Patent
Cheng

(10) Patent No.: US 8,248,077 B2
(45) Date of Patent: Aug. 21, 2012

(54) METHOD AND APPARATUS FOR OPERATING A CABLE FOR WIND FARMS

(75) Inventor: Po Wen Cheng, Delft (NL)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 13/234,619

(22) Filed: Sep. 16, 2011

(65) Prior Publication Data

US 2012/0139552 A1    Jun. 7, 2012

(51) Int. Cl.
*G01R 31/08* (2006.01)
(52) U.S. Cl. ......................................... 324/512; 324/520
(58) Field of Classification Search .................. None
See application file for complete search history.

(56) References Cited

U.S. PATENT DOCUMENTS
2012/0029892 A1* 2/2012 Thulke .............................. 703/7

OTHER PUBLICATIONS

Sensa a Schlumberger Company, "Power-Circuit Condition Monitoring", brochure Copyright 2010, pp. 1-8.

* cited by examiner

*Primary Examiner* — Minh N Tang
(74) *Attorney, Agent, or Firm* — Global Patent Operation; Douglas D. Zhang

(57) ABSTRACT

A wind energy system is provided including a geographical position sensing module and a cable for transmitting energy from the wind energy system. The cable includes a first sensing device at a first location of the cable. The first sensing device is adapted for sensing a relative position of the first sensing device. Further, the cable includes a second sensing device at a second location of the cable. The second sensing device is adapted for sensing a relative position of the second sensing device. The first and the second sensing devices are adapted to communicate with each other; and one of the first and second sensing devices is adapted to communicate with a geographical position sensing module of the wind energy system.

20 Claims, 8 Drawing Sheets

METHOD AND APPARATUS FOR OPERATING A CABLE FOR WIND FARMS

BACKGROUND OF THE INVENTION

The subject matter described herein relates generally to methods and systems for a wind turbine including a cable, and more particularly, to methods and systems for sensing conditions in a cable of a wind turbine.

Generally, a wind turbine includes a turbine that has a rotor that includes a rotatable hub assembly having multiple blades. The blades transform wind energy into a mechanical rotational torque that drives one or more generators via the rotor. The generators are sometimes, but not always, rotationally coupled to the rotor through a gearbox. The gearbox steps up the inherently low rotational speed of the rotor for the generator to efficiently convert the rotational mechanical energy to electrical energy, which is fed into a utility grid via at least one electrical connection. Gearless direct drive wind turbines also exist. The rotor, generator, gearbox and other components are typically mounted within a housing, or nacelle, that is positioned on top of a base that may be a truss or tubular tower.

Some wind turbine configurations include double-fed induction generators (DFIGs). Such configurations may also include power converters that are used to convert a frequency of generated electric power to a frequency substantially similar to a utility grid frequency. Moreover, such converters, in conjunction with the DFIG, also transmit electric power between the utility grid and the generator as well as transmit generator excitation power to a wound generator rotor from one of the connections to the electric utility grid connection. Alternatively, some wind turbine configurations include, but are not limited to, alternative types of induction generators, permanent magnet (PM) synchronous generators and electrically-excited synchronous generators and switched reluctance generators. These alternative configurations may also include power converters that are used to convert the frequencies as described above and transmit electrical power between the utility grid and the generator.

Known wind turbines have a plurality of mechanical and electrical components. Each electrical and/or mechanical component may have independent or different operating limitations, such as current, voltage, power, and/or temperature limits, when compared with other components. Moreover, known wind turbines typically are designed and/or assembled with predefined rated power limits. To operate within such rated power limits, the electrical and/or mechanical components may be operated with large margins for the operating limitations. Such operation may result in inefficient wind turbine operation, and a power generation capability of the wind turbine may be underutilized.

The electrical energy generated by the generator is transported to the users of electrical energy. For this purpose, wind energy systems have export cables connecting a wind farm to a power grid. In the case that the wind energy system is located in the sea, that is, the wind energy system is an offshore wind energy system, the cable connected to the power grid is at least partly a submarine cable. Although the cables are protected by being buried under the sea bed, extreme waves, currents, and sea bed movements can expose the cables and leave them vulnerable to the hydrodynamic forces of the sea. Furthermore, accidents with ships, for instance, by anchors of fisher boats, or earthquakes can damage the cable of an offshore wind turbine beyond repair.

Approximately 10% of the investments for an offshore wind farm are used for submarine cables. Broken cables have a great effect on the availability of the wind farm. Furthermore, the time span for repair activities concerning the submarine cables is in the range of several weeks, inter alia due to difficulties in finding access to the cable.

Thus, there is a desire for a cable for an offshore wind turbine which facilitates maintenance and repair and also saves time as well as costs caused by the maintenance and the repair.

BRIEF DESCRIPTION OF THE INVENTION

In one aspect, a wind energy system with a geographical position sensing module for determining an absolute position of the geographical position sensing module and a cable adapted for transmitting energy from the wind energy system is provided. The cable includes a first sensing device at a first location of the cable. The first sensing device is adapted for sensing a relative position of the first sensing device. Further, the cable includes a second sensing device at a second location of the cable. The second sensing device is adapted for sensing a relative position of the second sensing device. The first and the second sensing devices are adapted to communicate with each other; and one of the first or second sensing devices is adapted to communicate with the geographical position sensing module of the wind energy system.

In another aspect, a cable for transmitting energy from a wind energy system is provided. The cable includes a first sensing device at a first location of the cable. The first sensing device is adapted for sensing a relative position of the first sensing device. Further, the cable includes a second sensing device at a second location of the cable. The second sensing device is adapted for sensing a relative position of the second sensing device. The first and the second sensing devices are adapted to communicate with each other; and one of the first and second sensing devices is adapted to communicate with a geographical position sensing module of a wind energy system.

In yet another aspect, a method for sensing parameters of a conducting cable, adapted for transmitting energy from a wind energy system, is provided. The method includes determining the relative position of a first sensing device at a first location of the cable with respect to a second sensing device at a second location of the cable; communicating the position of at least one of the first and second sensing devices to the respective other one of the first and second sensing devices; and, determining the relative position of the first or second sensing device with respect to an absolute position of a geographical position sensing module of a wind energy system.

Further aspects, advantages and features of the present invention are apparent from the dependent claims, the description and the accompanying drawings.

BRIEF DESCRIPTION OF THE DRAWINGS

A full and enabling disclosure including the best mode thereof, to one of ordinary skill in the art, is set forth more particularly in the remainder of the specification, including reference to the accompanying figures wherein.

DETAILED DESCRIPTION OF THE INVENTION

Figure 1:
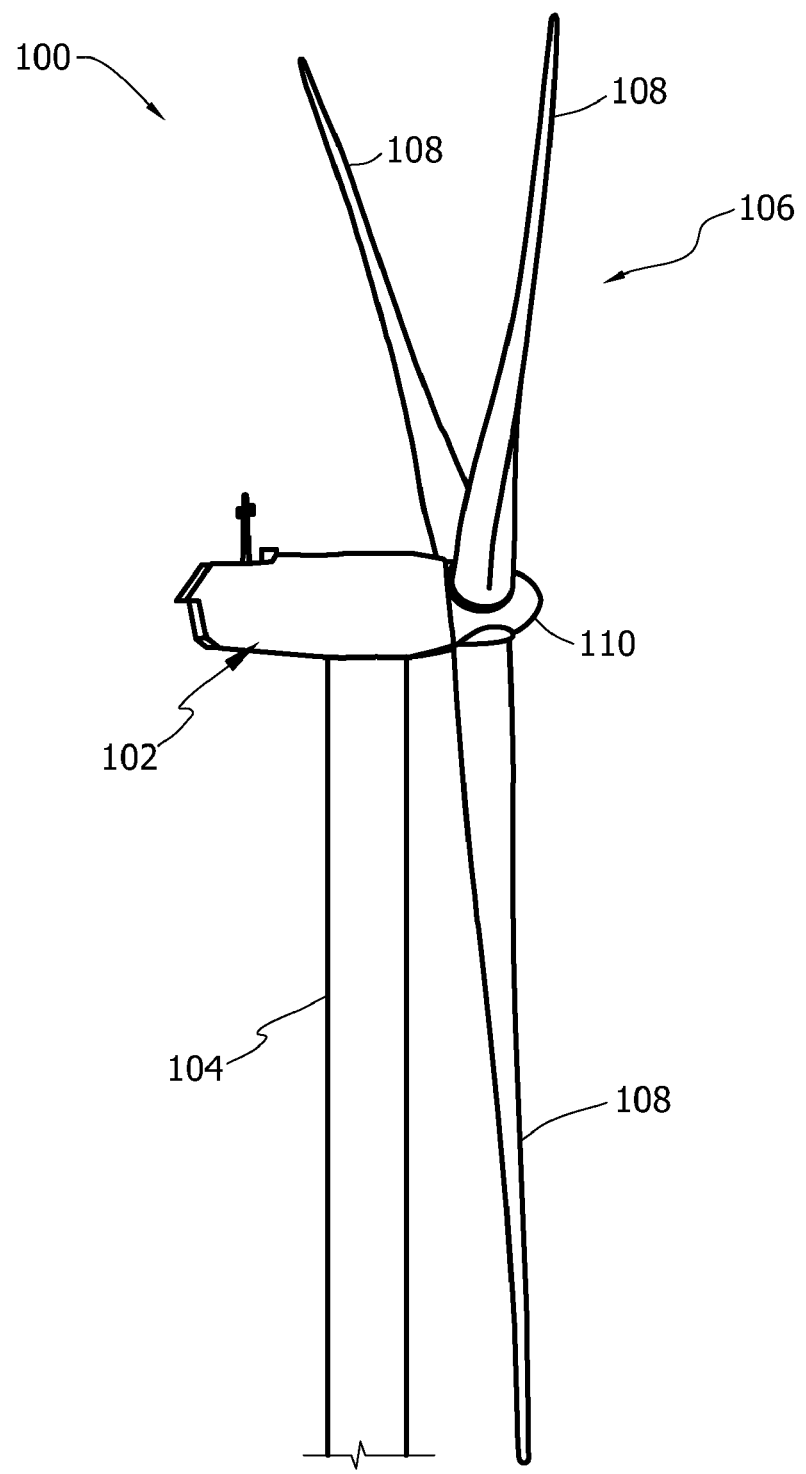
FIG. 1 is a perspective view of a portion of an exemplary wind turbine.

Reference will now be made in detail to the various embodiments, one or more examples of which are illustrated in each figure. Each example is provided by way of explanation and is not meant as a limitation. For example, features illustrated or described as part of one embodiment can be used on or in conjunction with other embodiments to yield yet further embodiments. It is intended that the present disclosure includes such modifications and variations.

The embodiments described herein include a wind energy system with a cable and a cable for a wind energy system that allows for locating the cable. More specifically, the embodiments described herein provide a cable which is able to track the performance of the cable, for instance by sensing parameters such as location, temperature and/or vibration of the cable. Further, the cable may be able to sense the wave condition and monitor the wave conditions along the cable route. In addition, the cable according to embodiments described herein, is adapted to give an indication about the cable's well being to allow for preventive action before any damage to the cable progresses to a state where repair is not possible anymore. In the case that a cable is damaged, the wind energy system, the cable, and the method according to embodiments described herein allow for quickly identifying the location of a cable failure, thus saving time and costs.

As used herein, the term "sensing device" is intended to be representative of a sensing module, which is able to sense the location of the device. Typically, the sensing device may be able to determine a relative position of the sensing device. According to some embodiments, the sensing device is adapted for determining a relative position of itself to another sensing device, such as a sensing device next to it. Typically, the sensing device is adapted to determine the relative position of itself at a first point of time compared to a position at a second point of time before the first point of time. For instance, the sensing device may have an initial position when mounted to a cable and senses the position changes with respect to the initial position during the lifetime by sensing movements of the cable. Typically, the sensing device is adapted to receive position data from other sensing devices and to send or transmit position data to other sensing devices. According to some embodiments, the sensing device is able to determine the own position dependent on the position of received data of another sensing device. Typically, the sensing device may calculate its own position by using received data from other sensing devices as well as movement data. According to embodiments described herein, the sensing device is able to communicate with a geographical position sensing module located in a wind turbine or an offshore substation.

Typically, a wind energy system includes at least one wind turbine. According to some embodiments described herein, a wind energy system includes at least one wind turbine and a substation, as explained in detail with respect to FIG. 4. Generally, the wind energy system described herein is able to determine a cable failure by checking parameters of the cable sensed by sensing devices, as described in detail below.

As used herein, the term "blade" is intended to be representative of any device that provides a reactive force when in motion relative to a surrounding fluid. As used herein, the term "wind turbine" is intended to be representative of any device that generates rotational energy from wind energy, and more specifically, converts kinetic energy of wind into mechanical energy. As used herein, the term "wind generator" is intended to be representative of any wind turbine that generates electrical power from rotational energy generated from wind energy, and more specifically, converts mechanical energy converted from kinetic energy of wind to electrical power.

FIG. 1 is a perspective view of a portion of an exemplary wind turbine 100. Wind turbine 100 includes a nacelle 102 housing a generator (not shown in FIG. 1). Nacelle 102 is mounted on a tower 104 (a portion of tower 104 being shown in FIG. 1). Tower 104 may have any suitable height that facilitates the operation of wind turbine 100 as described herein. Wind turbine 100 also includes a rotor 106 that includes three blades 108 attached to a rotating hub 110. Alternatively, wind turbine 100 includes any number of blades 108 that facilitates the operation of wind turbine 100 as described herein. In the exemplary embodiment, wind turbine 100 includes a gearbox (not shown in FIG. 1) operatively coupled to rotor 106 and a generator (not shown in FIG. 1).

Figure 2:
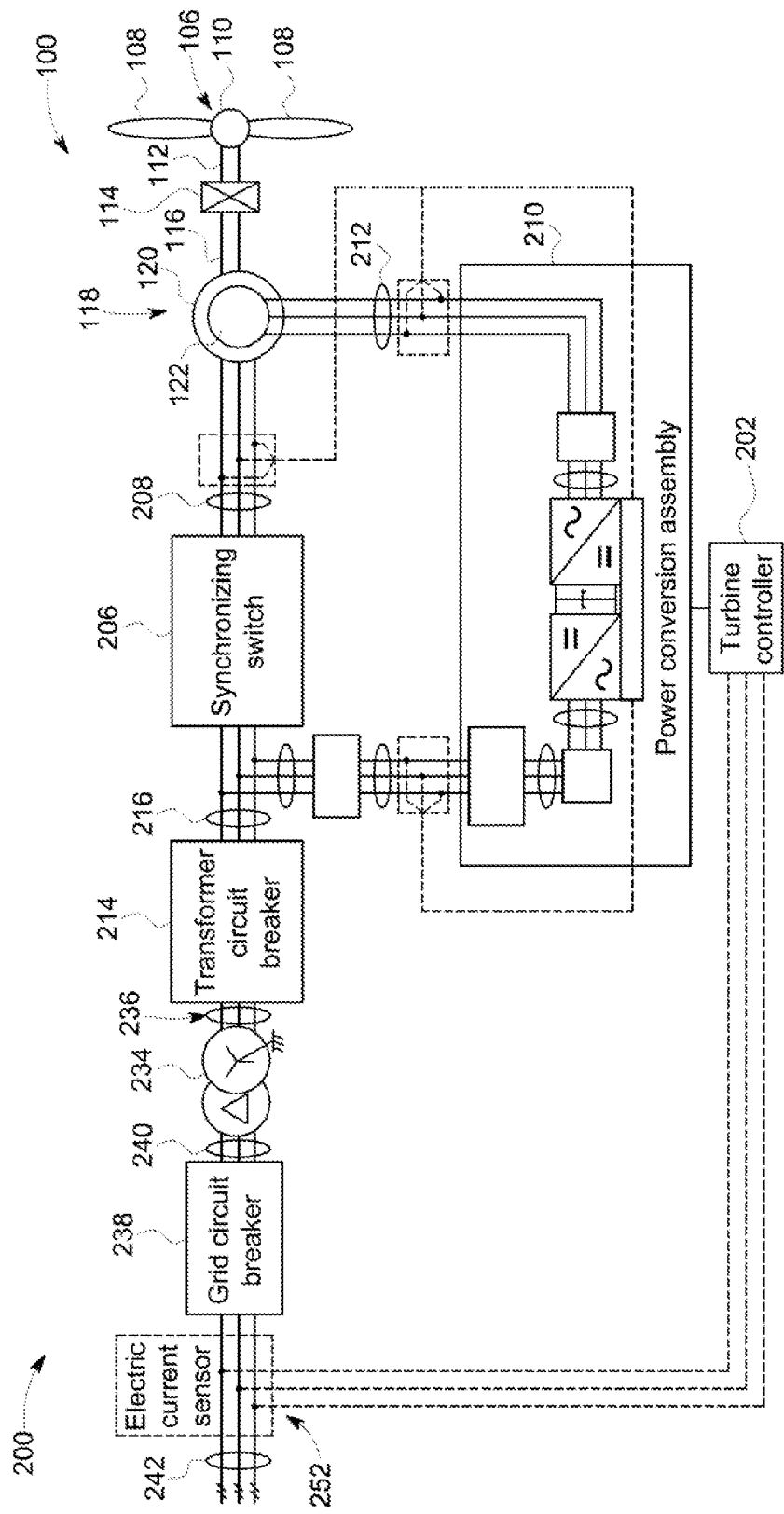
FIG. 2 is a schematic view of an exemplary electrical and control system suitable for use with the wind turbine shown in FIG. 1.

FIG. 2 is a schematic view of an exemplary electrical and control system 200 that may be used with wind turbine 100. Rotor 106 includes blades 108 coupled to hub 110. Rotor 106 also includes a low-speed shaft 112 rotatably coupled to hub 110. Low-speed shaft 112 is coupled to a step-up gearbox 114 that is configured to step up the rotational speed of low-speed shaft 112 and transfer that speed to a high-speed shaft 116. In the exemplary embodiment, gearbox 114 has a step-up ratio of approximately 70:1. For example, low-speed shaft 112 rotating at approximately 20 revolutions per minute (rpm) coupled to gearbox 114 with an approximately 70:1 step-up ratio generates a speed for high-speed shaft 116 of approximately 1400 rpm. Alternatively, gearbox 114 has any suitable step-up ratio that facilitates the operation of wind turbine 100 as described herein. As a further alternative, wind turbine 100 includes a direct-drive generator that is rotatably coupled to rotor 106 without any intervening gearbox.

High-speed shaft 116 is rotatably coupled to generator 118. In the exemplary embodiment, generator 118 is a wound rotor, three-phase, double-fed induction (asynchronous) generator (DFIG) that includes a generator stator 120 magnetically coupled to a generator rotor 122. In an alternative embodiment, generator rotor 122 includes a plurality of permanent magnets in place of rotor windings.

Electrical and control system 200 includes a turbine controller 202. Turbine controller 202 includes at least one processor and a memory, at least one processor input channel, at least one processor output channel, and may include at least one computer (none shown in FIG. 2). As used herein, the term computer is not limited to integrated circuits referred to in the art as a computer, but broadly refers to a processor, a microcontroller, a microcomputer, a programmable logic controller (PLC), an application specific integrated circuit, and other programmable circuits (none shown in FIG. 2), and these terms are used interchangeably herein. In the exemplary embodiment, memory may include, but is not limited to, a computer-readable medium, such as a random access memory (RAM) (none shown in FIG. 2). Alternatively, one or more storage devices, such as a floppy disk, a compact disc read only memory (CD-ROM), a magneto-optical disk (MOD), and/or a digital versatile disc (DVD) (none shown in FIG. 2) may also be used. Also, in the exemplary embodiment, additional input channels (not shown in FIG. 2) may be, but are not limited to, computer peripherals associated with an operator interface such as a mouse and a keyboard (neither shown in FIG. 2). Further, in the exemplary embodiment, additional output channels may include, but are not limited to, an operator interface monitor (not shown in FIG. 2).

Processors for turbine controller 202 process information transmitted from a plurality of electrical and electronic devices that may include, but are not limited to, voltage and current transducers. RAM and/or storage devices store and transfer information and instructions to be executed by the processor. RAM and/or storage devices can also be used to store and provide temporary variables, static (or, non-changing) information and instructions, or other intermediate information to the processors during execution of instructions by the processors. Instructions that are executed include, but are not limited to, resident conversion and/or comparator algorithms. The execution of sequences of instructions is not limited to any specific combination of hardware circuitry and software instructions.

Generator stator 120 is electrically coupled to a stator synchronizing switch 206 via a stator bus 208. In an exemplary embodiment, to facilitate the electrical power configuration, generator rotor 122 is electrically coupled to a bi-directional power conversion assembly 210 via a rotor bus 212. Alternatively, generator rotor 122 is electrically coupled to rotor bus 212 via any other device that facilitates the operation of electrical and control system 200 as described herein. As a further alternative, electrical and control system 200 is configured as a full power conversion system (not shown) that includes a full power conversion assembly (not shown in FIG. 2), similar in design and operation to power conversion assembly 210 and electrically coupled to generator stator 120. The full power conversion assembly facilitates channeling electric power between generator stator 120 and an electric power transmission and distribution grid (not shown).

Turbine controller 202 is configured to receive a plurality of voltage and electric current measurement signals from a first set of voltage and electric current sensors 252. Moreover, turbine controller 202 is configured to monitor and control at least some of the operational variables associated with wind turbine 100. In the exemplary embodiment, each of three voltage and electric current sensors 252 are electrically coupled to each one of the three phases of grid bus 242. Alternatively, voltage and electric current sensors 252 are electrically coupled to system bus 216. As a further alternative, voltage and electric current sensors 252 are electrically coupled to any portion of electrical and control system 200 that facilitates operation of electrical and control system 200 as described herein. As a still further alternative, turbine controller 202 is configured to receive any number of voltage and electric current measurement signals from any number of voltage and electric current sensors 252 including, but not limited to, one voltage and electric current measurement signal from one transducer.

During operation, wind impacts blades 108 and blades 108 transform wind energy into a mechanical rotational torque that rotatably drives low-speed shaft 112 via hub 110. Low-speed shaft 112 drives gearbox 114 that subsequently steps up the low rotational speed of low-speed shaft 112 to drive high-speed shaft 116 at an increased rotational speed. High speed shaft 116 rotatably drives generator rotor 122. A rotating magnetic field is induced by generator rotor 122 and a voltage is induced within generator stator 120 that is magnetically coupled to generator rotor 122. Generator 118 converts the rotational mechanical energy to a sinusoidal, three-phase alternating current (AC) electrical power signal in generator stator 120. The associated electrical power is transmitted to main transformer 234 via stator bus 208, stator synchronizing switch 206, system bus 216, main transformer circuit breaker 214 and generator-side bus 236. Main transformer 234 steps up the voltage amplitude of the electrical power and the transformed electrical power is further transmitted to a grid via breaker-side bus 240, grid circuit breaker 238 and grid bus 242.

Figure 3:
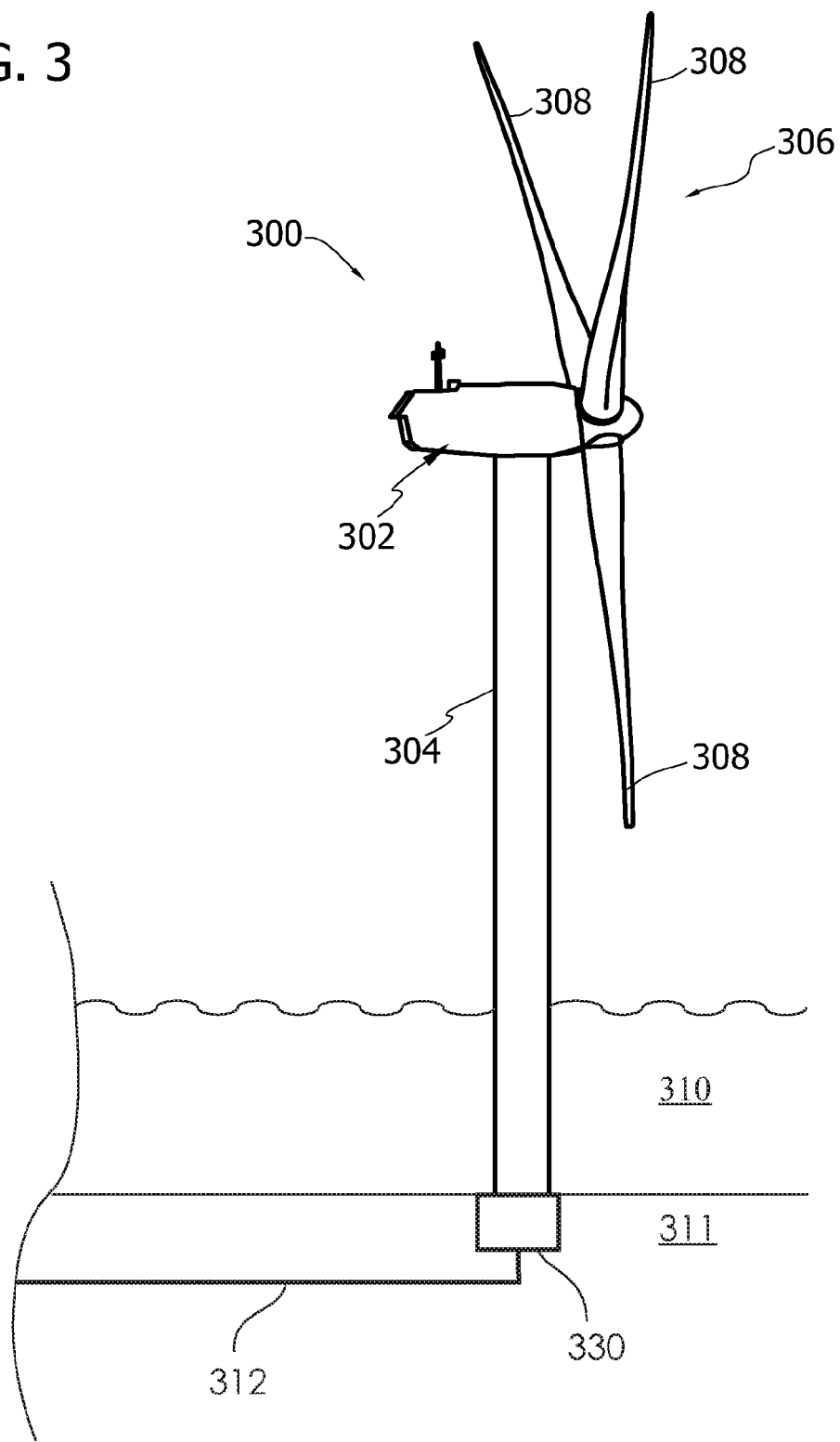
FIG. 3 is a schematic view of an offshore wind turbine with a cable.

FIG. 3 shows a wind turbine 300 including a cable 312 with which the electrical power generated by the wind turbine 300 is transported to a substation (not shown) or a power grid (not shown). The wind turbine includes a nacelle 302, a rotor 306 with rotor blades 308 and a tower 304. Details for such or similar components are described with respect to the FIGS. 1 and 2.

Typically, the wind energy system as described herein is an offshore wind energy system. That means the wind energy system is located at sea, using the wind conditions on the open sea.

A part of the tower 304 of the wind energy system 300 is located in the sea 310 in FIG. 3. The tower 304 is mounted to the sea bed 311 by a base 330. The base 330 is able to hold the tower 304 of the wind turbine 300 in a desired position during the lifetime of the wind turbine.

Figure 4:
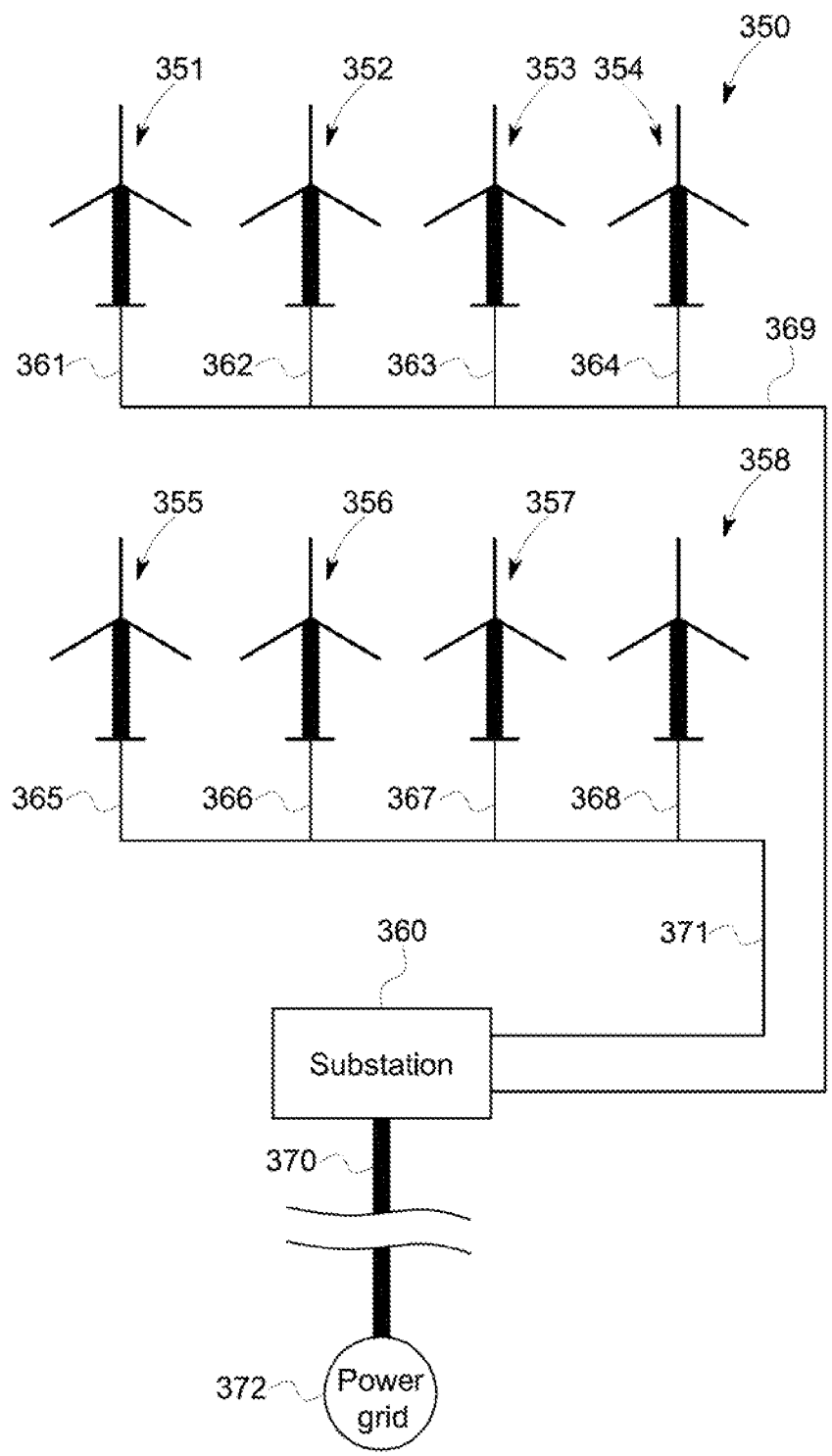
FIG. 4 is a schematic view of a wind energy system.

FIG. 4 shows an arrangement of a wind energy system 350. Typically, the wind energy system shown in FIG. 4 can be described as being a wind energy farm. The wind energy farm 350 includes several wind turbines 351 to 358. Eight wind turbines are exemplarily shown in FIG. 4; however, the number of wind turbines in a wind energy system may be less than eight, such as six or five. According to embodiments described herein, the number of wind turbines in a wind energy system may be greater than eight, such as ten, sixteen, twenty or above.

Typically, the wind energy system includes an offshore substation collecting the energy of the individual wind turbines. Reference number 360 indicates such an offshore substation in FIG. 4. Typically, the offshore substation 360 collects the power from the arrays of wind turbines of the wind farm 350 and steps up the voltage for high voltage transmission.

According to some embodiments, a geographical position sensing module as described herein may be located at the substation.

For transmitting energy, the wind turbines are connected to each other, as well as to the substation. For instance, array cables 361 to 369 and 371 lead from the wind turbines 351 to 358 to the substation 360. According to embodiments described herein, the substation 360 is connected via export cable 370 to an energy transmission grid 372, which may be an onshore transmission grid.

Typically, cables referred to herein may be array cables and/or export cables of a wind energy farm. The following figures show exemplarily array cables of wind turbines, which should not be understood as a limitation. Export cables of a wind energy system can also be equipped with the features exemplarily described with respect to array cables of wind turbines.

With the growth in the offshore wind energy sector, the demand for the electrical infrastructure also increases. Cabling between the offshore wind turbines, and especially cables, constitutes a significant part of the costs of an offshore project. For instance, for an offshore wind farm of exemplarily 288 MW the cables cost about 190 Million Euros (about 270 Million US$). Thus, maintenance and repair of the cables are a considerable factor when planning an offshore wind farm including several wind turbines.

Figure 5:
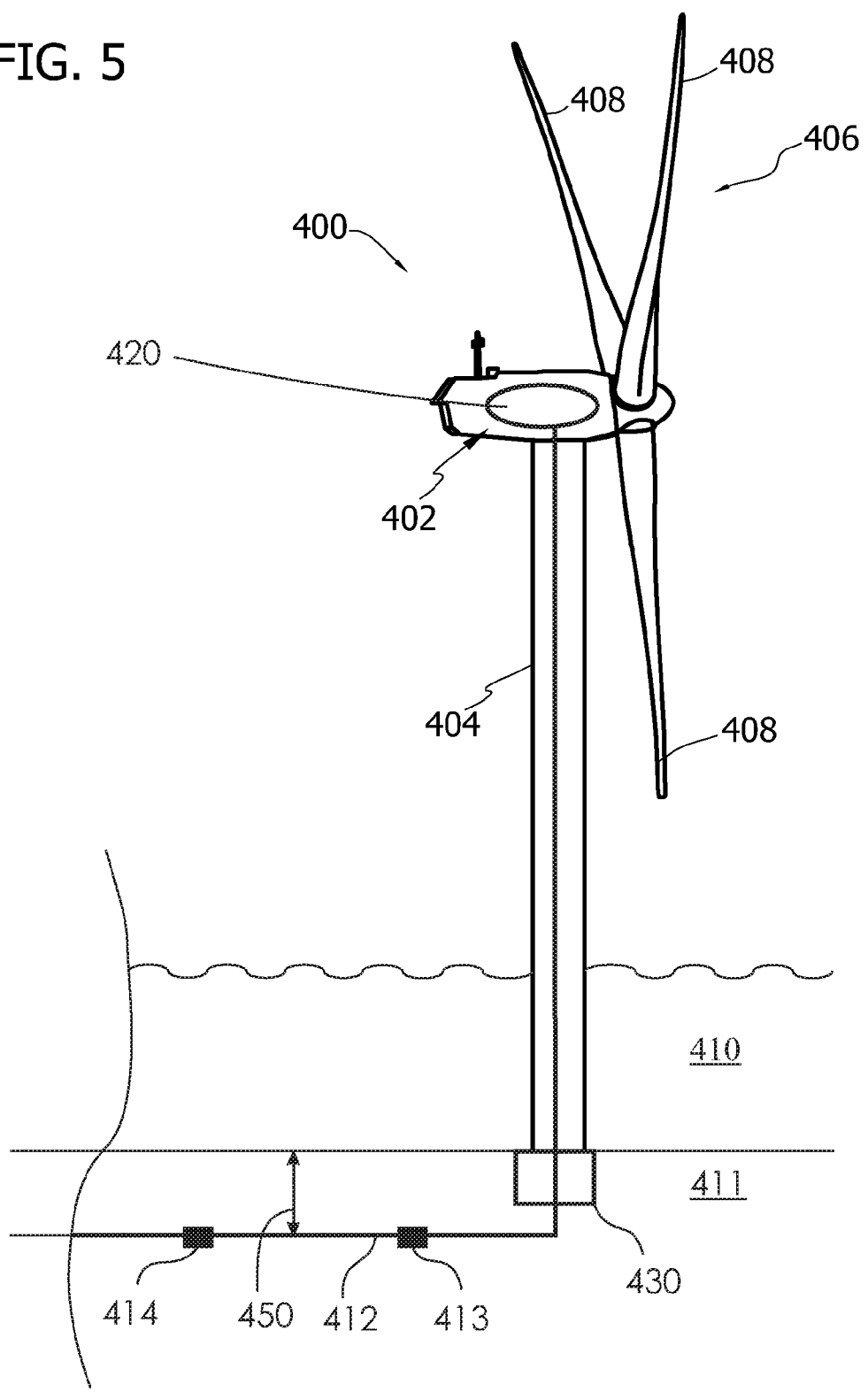
FIG. 5 is a schematic view of an offshore wind turbine with a cable according to embodiments described herein.

FIG. 5 shows a wind turbine according to embodiments described herein. The shown wind turbine 400 has components like a nacelle 402, a rotor 406, rotor blades 408 and a tower 404, which may be components as described above. The tower 404 of the wind turbine 400 may be mounted to base 430 allowing fixing the wind energy system 400 to the sea bed 411 of the sea 410.

According to embodiments described herein, the wind turbine 400 includes a cable 412. Only a section of the cable of the wind turbine is shown in FIG. 5. Typically, one end of the cable 412 may be adapted to be connected to the wind turbine 400 and the other one (not shown) may be adapted to be connected to an offshore substation as shown in FIG. 4. Typically, the cable 412 is buried in the sea bed 411 to a depth 450, as can be seen in FIG. 5.

According to some embodiments, the cable is adapted to transmit the electrical power generated by the generator of the wind energy system to a power grid (not shown).

As can exemplarily be seen in FIG. 5, the cable 412 includes at least two sensing devices 413 and 414. According to some embodiments described herein, the sensing devices may be connected to the cable (for instance, mechanically, electrically or both). According to embodiments, which can be combined with other embodiments described herein, the sensing devices may be integrated in the cable or the housing of the cable. Typically, the sensing device may be attached to the cable during manufacturing or during mounting of the cable.

Typically, the cable 412 is connected to a geographical position sensing module 420 of the wind turbine 400 or of an offshore substation. For instance, the geographical position sensing module 420 may be part of the control system of the wind energy system, as explained in detail above with respect to FIG. 2. Typically, the geographical position sensing module is able to communicate with a control system, a sensing device, or both.

According to some embodiments, the geographical position sensing module may be able to determine the absolute position of itself. An "absolute position" as used herein should be understood as a position, which is unambiguously related to a certain point in space. For instance, an absolute position may include information about the degree of longitude and the degree of latitude. If the cable is connected at one end with the geographical position sensing module, the geographical sensing device is able to determine the geographical position of the cable end.

Typically, the geographical position sensing module may be a global positioning system (GPS) module, which is able to determine the exact geographical position of itself. According to some embodiments described herein, the geographical position sensing module may be able to communicate the exact position to a controller or to another sensing device. Typically, the geographical position sensing module may be a GPS transponder.

According to embodiments, which can be combined with other embodiments described herein, the geographical sensing device may be able to transmit information to a control system. For instance, information received from a sensing device may be transmitted, via the geographical position sensing module, to the control system of the wind energy system.

Typically, the geographical position sensing module of the wind turbine, which is adapted to receive data from at least one sensing device of the cable, may be part of the supervisory control system of the wind energy system. According to some embodiments, the geographical position sensing module of the wind turbine may be connected to the supervisory control system of the wind energy system. The supervisory control system may be adapted to trigger an alarm if the values received from the geographical position sensing module are not within a predetermined range of threshold values.

Two sensing devices 413 and 414 are exemplarily shown in the section of the cable shown in FIG. 5. According to some embodiments, the number of sensing devices may vary according to the cable requirements, the size of the wind energy system, the length of the cable, the conditions of the sea and the sea bed, the communication range of the sensing devices, and the like. Thus, the number of sensing devices may be adapted so that a sensing device is provided after a predetermined length of the cable. For instance, a sensing device may be mounted every 500 m to the cable. Typically, the distance between the sensing devices may be between about 50 m to about 5000 m, more typically between about 100 m and about 2000 m, and even more typically between about 200 m and about 1000 m.

As an example, approximately between ten and twenty sensing devices may be arranged at a cable having a length of 10 km.

Figure 6:
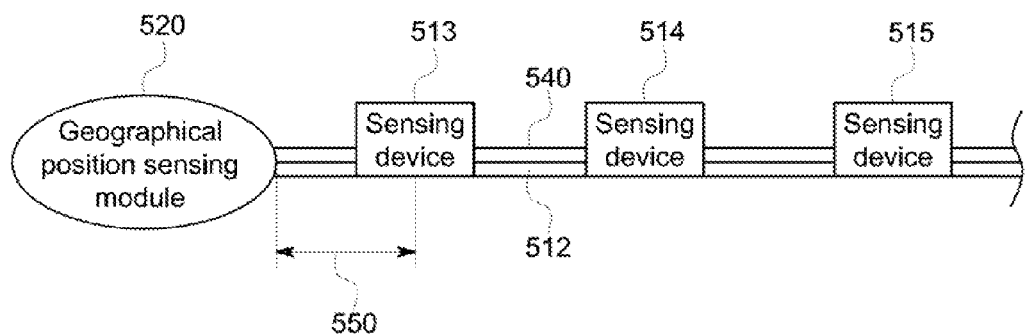
FIG. 6 is a schematic view of a section of a cable for a wind energy system according to embodiments described herein.

FIG. 6 shows a section of a cable according to embodiments described herein. Typically, the cable 512 is adapted to transmit electrical power from a wind turbine to a substation of a wind energy system. According to some embodiments, the cable 512 may be adapted to transmit energy from a substation of a wind energy system to a power grid. The section of cable 512 shown in FIG. 6 exemplarily includes three sensing devices 513, 514, and 515. As mentioned above with respect to FIG. 5, the number of sensing devices may vary dependent on several parameters. Thus, the three sensing devices should be understood as a mere example of an embodiment.

Typically, the distance 550 between a first sensing device 513 and one end of the cable is between about 50 m to about 1000 m, more typically between about 70 m and about 700 m, and even more typically between about 100 m and about 500 m. Typically, the distance between a second sensing device 515 and one end of the cable is between about 50 m to about 1000 m, more typically between about 70 m and about 700 m, and even more typically between about 100 m and about 500 m. According to some embodiments, the distance between the first sensing device or the second sensing device and one end of the cable being connected to the geographical position sensing device is larger than the rotor diameter of the wind energy system, in order to distinguish the sensing devices of the cable from the sensing devices of the remaining wind energy system.

It is therefore possible to allow the monitoring of the cable performance not only on the turbine side, at the end of the cable, but also to shift the monitoring to the cable side.

According to some embodiments, the sensing devices are able to determine a relative position of themselves. For instance, the sensing devices may include an acceleration sensor sensing movements of the cable at the respective position of the sensing devices. By sensing the movements, the sensing device is able to determine the actual position, respectively the amendment of the position of the sensing device. Typically, the sensing devices may be acceleration sensors with calibrated integration constants. According to some embodiments, the sensing devices may also be velocity or displacement sensors. Typically, the sensing devices may use different physical principles, depending on the structure and function of the sensing device. For instance, the sensing devices may use the piezo-effect, fiber optic, and/or laser effects.

According to some embodiments, the sensing devices may determine their relative position by communicating with each other. Typically, the sensing devices may determine their relative position by communicating in a network. The network may provide several knots, which help identifying the distance of the sensing devices to one or more knots. For instance, the sensing device may gather information about the relative position by identifying the distance to one or more knots. According to some embodiments, the knots of the network may be other sensing devices.

At least one of the sensing devices may be able to communicate with a geographical position sensing module of the wind energy system as well as with another sensing device.

According to some embodiments, the sensing devices communicate with each other by exchanging information. For instance, the sensing devices according to embodiments described herein may be able to receive and transmit the relative position of further sensing devices. For instance, the sensing device 514 may be able to receive the position of sensing device 515 and transmit the own position, or the position of sensing device 514, and the position of sensing device 515 to sensing device 513.

According to some embodiment described herein, one end of the cable 512 is connected to a geographical position sensing module 520 of a wind energy system (not shown in FIG. 6).

Typically, the geographical position sensing module may be a geographical position sensing module as described above, for instance with respect to FIG. 5. According to embodiments, the geographical position sensing module may be a GPS module.

As can exemplarily be seen in FIG. 6, the sensing devices 513, 514, and 515 are connected via a connection 540. According to some embodiments, the connection 540 may be an optical fiber to transmit the required information from one sensing device to another or from one sensing device to the geographical position sensing module 520.

Figure 7:
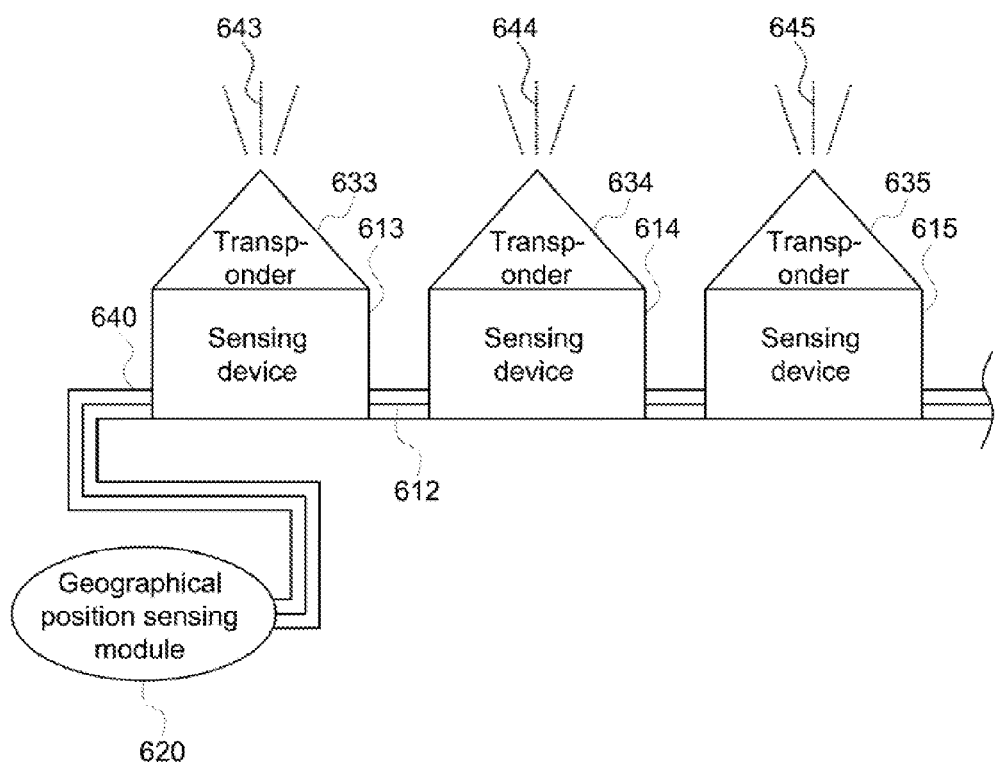
FIG. 7 is a schematic view of a section of a cable for a wind energy system having a position transponder according to embodiments described herein.

FIG. 7 shows an embodiment including sensing devices 613, 614, and 615 with position transponders 633, 634, and 645 attached to a cable 612. Typically, the cable 612 is connected to a geographical position sensing module 620, which may be a geographical position sensing module as described above. According to some embodiments, the sensing devices 613, 614, and 615 are interconnected by an optical fiber 640.

The position transponder according to embodiments describes herein may be able to transmit signals 643, 644, and 645 (shown as dashed lines in FIG. 7) to a third party being distant from the cable. Typically, the third party may be a receiver on an approaching object. The term "a third party being distant from the cable" should be understood as a third party being not connected, attached, or mounted to the cable, but provides a certain distance to the cable.

Typically, the signals 643, 644, and 645 of transponders 633, 634, and 635 may include information about the position of the cable 612 or the position of the sensing devices 613, 614, and 615 for approaching objects as a preventive warning. For instance, the transponder may transmit the position to a ship, which enters a predetermined area around the cable. The ship may consider the transmitted position when deciding where to anchor. According to embodiments, which can be combined with other embodiments described herein, the sensing device may receive data from a third party such as a ship and provide the information to the supervisory control system, such as the SCADA (supervisory control and data acquisition system) of the wind energy system.

According to some embodiments, which can be combined with other embodiments described herein, the sensing devices are adapted to sense the position of the sensing device under ground. Typically, the sensing devices are adapted to sense the depth of the cable in the sea bed. The depth of the cable in the sea bead is exemplarily shown in FIG. 5 with reference number 450.

Figure 8:
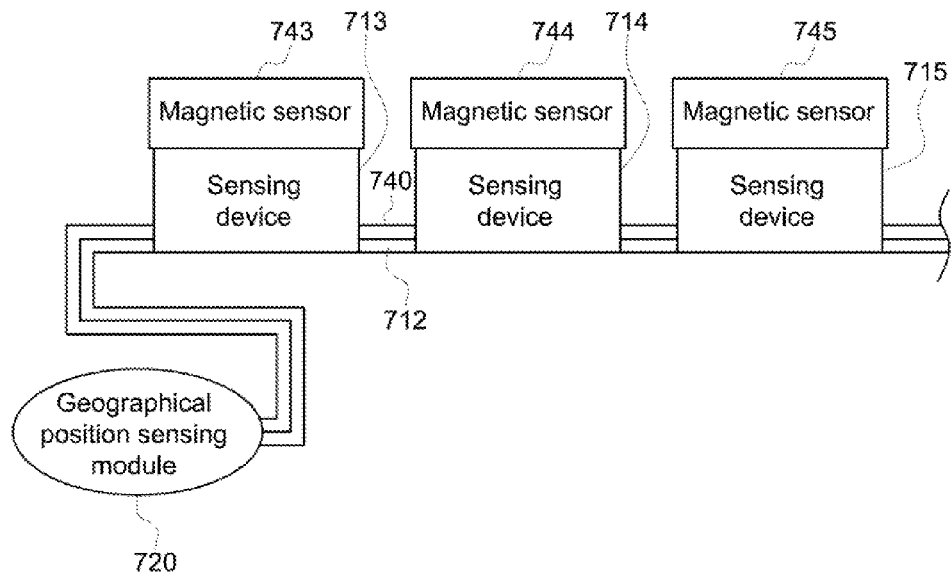
FIG. 8 is a schematic view of a section of a cable for a wind energy system having a magnetic sensor according to embodiments described herein.

According to some embodiments, the sensing devices may provide information about whether the cable is still buried or not. FIG. 8 shows a cable 712 including sensing devices 713, 714, and 715 with magnetic sensors 743, 744, and 745. Typically, cable 712 is connected to a geographical position sensing module 720, which may be a geographical position sensing module as described above. Further, sensing devices 713, 714, and 715 are exemplarily interconnected by optical fiber 740.

In the embodiment shown in FIG. 8, the sensing devices 713, 714, and 715 include magnetic sensors 743, 744, and 745 to determine whether the cable is buried in the sea bed.

According to some embodiments, a magnetic field is generated and sensed by the magnetic sensor in the sensing devices. The magnetic field has a different strength if the sensing device is in water or buried in the sea bed. Typically, the sensing device may transmit the information about the strength of the magnetic field, and thus, the position of the cable in the sea bed, to another sensing device or to the geographical position sensing module, which may be connected to a control system of the wind turbine.

According to some embodiments which can be combined with other embodiments described herein, the sensing devices may be adapted to sense further conditions of the cable. For instance, the sensing devices may be able to measure the temperature of the cable. Further functions may also be included in the sensing device, such as vibration measurement of the cable and the like. The vibration measurement may also be used to monitor the movements of the cable. According to some embodiments, the sensing devices may be adapted to sense further parameters influencing the cable such as cable stress, cable deformation and wave conditions. Typically, the information gathered about several conditions of the cable may be received and transmitted in the same way as the position data is received and transmitted. That is, the information about the temperature or the vibrations of the cable may—for example—be transferred from one sensing device to another sensing device. At least one sensing device may be adapted to transmit the information to the geographical position sensing module of the wind energy system.

The geographical position sensing module may be adapted to receive and transmit data and information about several conditions of the cable sensed by the sensing devices, such as temperature and vibrations and the like.

According to some embodiments, which can be combined with other embodiments described herein, the wind energy system is able to determine a cable failure based on the data received from the sensing devices (for instance, via the geographical position sensing module). The control system of the wind energy system may determine a cable failure by checking the sensed parameters of the sensing device, which may be performed by comparing it with threshold values or the like. Typically, a cable failure may be understood as a distortion of the desired cable function, an interruption of the desired cable function, a location of the cable deviating from the desired cable location, a situation deviating from the desired situation, and the like.

As an example, if the control system gets a signal from the first sensing device, but not from the second sensing device, the control system may determine an interruption in the signal transmission between control system and second sensing device. Typically, the control system, such as the SCADA of the wind energy system may trigger an alarm in order to inform the operator about the cable failure.

In another example, the sensing devices of the cable determine the depth of the cable in the sea bed at the respective location of the sensing devices. The values of the sensing devices are transmitted to the control system of the wind energy system, which may determine (e.g. by a comparison with threshold values, by calculations, or the like), whether the cable is sufficiently buried in the sea bed or even whether the cable is still buried at all. The control system may trigger an alarm in order to inform about an abnormal situation.

Figure 9:
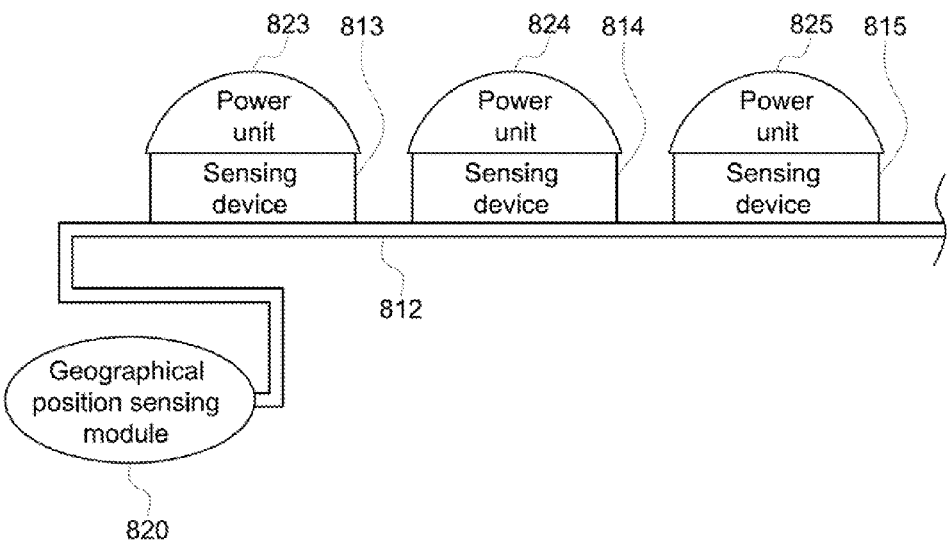
FIG. 9 is a schematic view of a section of a cable for a wind energy system according to further embodiments described herein; and, FIG. 10 is a flow chart showing a method for sensing parameters of a cable according to embodiments described herein.

FIG. 9 shows an embodiment of the cable which can be combined with other embodiments described herein. The cable 812 is equipped with sensing devices 813, 814, and 815. Typically, the sensing devices 813, 814, and 815 are mechanically connected to the cable 812. In the embodiment shown in FIG. 9, the sensing devices 813, 814, and 815 have their own power units 823, 824, and 825. The power units 823, 824, and 825 provide the energy for the sensing devices 813, 814, and 815. For instance, the power units 823, 824, and 825 allow the sensing devices 813, 814, and 815 to determine the position, which may exemplarily be the position of the sensing devices relative to each other without being electrically connected to the cable. Typically, the power units also allow for sending information to another sensing device or to a geographical position sensing module. According to some embodiments, the power units 823, 824, and 825 allow the sensing devices 813, 814, and 815 to determine further conditions of the cable 812, such as temperature, pressure, vibrations, position of the sensing devices under ground and the like.

According to some embodiments, the power units of the sensing devices may include power units charged by electromagnetic waves, radio waves, conventional power, such as a battery, or the like.

Typically, the sensing devices include network capabilities for communicating with each other and the geographical position sensing module. For instance, the sensing devices may be able to communicate via IP or a local network. According to some embodiments, the sensing devices may be adapted to communicate under water or in a buried state with each other. Typically, the sensing devices are adapted to be able to communicate with each other via network over a distance of typically about 10 m to about 25000 m, more typically about 20 m to about 2000 m and even more typically about 100 m to about 1500 m. In the case that the sensing devices are part of a wireless network, a connection between the sensing devices, such as a fiber optic connection may be omitted.

The sensing devices 813, 814, and 815 of FIG. 9 communicate via a wireless network with each other. Typically, the sensing devices may use radio frequencies or other wireless communication protocols for communicating. The connection of the sensing devices, as shown in FIG. 6 as the fiber 540, may be omitted in the embodiment of FIG. 9.

Typically, the communication of the sensing devices of the cable for a wind energy system according to embodiments described herein is not limited to the supervisory control of end devices of a cable, but provides instead a system which is able to provide information over the length of the cable.

The sensing devices according to embodiments may include sensors as used with consumer devices and in automotive applications. In this way, the costs of the sensing devices remain low.

Typically, the cables described with respect to FIGS. 6 to 9 may be used in a wind energy system, more typically in an offshore wind energy system. The geographical position sensing modules in FIGS. 6 to 9 may be part of an offshore wind energy system.

Figure 10:
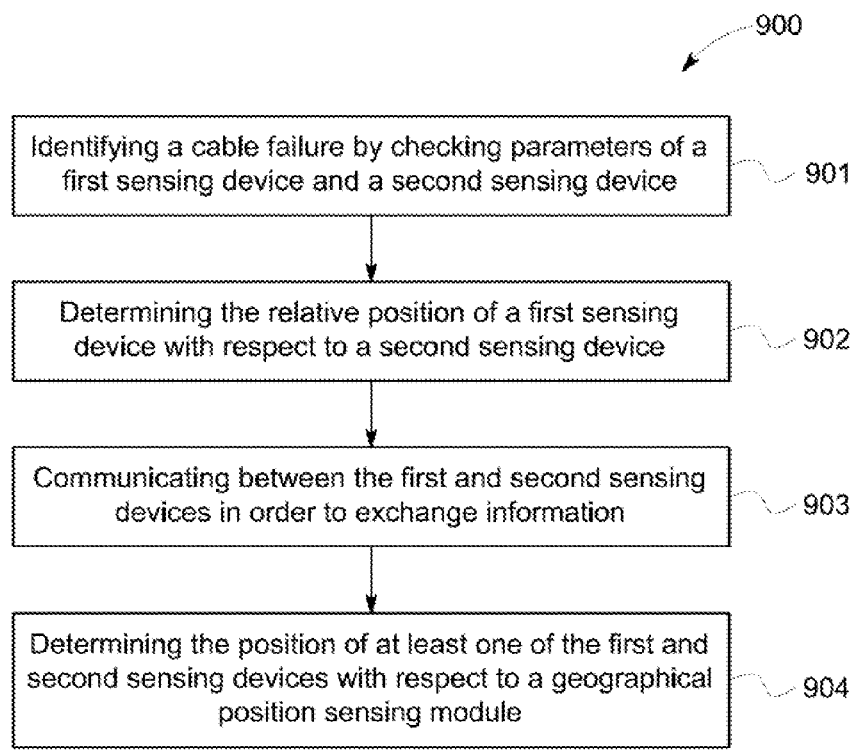

FIG. 10 shows a flow chart of a method sensing parameters of a conducting cable according to embodiments described herein. The cable may be a cable for transmitting energy from a wind energy system as described above. For instance, the wind energy system may be an offshore wind energy system.

In the method 900, reference number 901 indicates identifying a cable failure by checking parameters of a first sensing device and a second sensing device. According to some embodiments, the sensing devices may be sensing devices as described above with respect to FIGS. 6 to 9. Typically, checking parameters may take place by supervising the parameters gathered by the sensing devices. According to some embodiments, the supervising may be performed by a control system of the wind energy system. Typically, checking parameters may include a comparison of the sensed parameters with threshold values or threshold ranges. According to some embodiments, checking parameters may include calculating if an alarm should be triggered. The control system of the wind energy system as described above with respect to FIG. 2 may be used for it.

Box 902 indicates determining the relative position of a first sensing device with respect to a second sensing device. Typically, the first sensing device is located at a first location of the cable and the second sensing device is located at a second location of the cable. According to some embodiments, the first and the second sensing devices may be arranged in a distance of about 50 m to 5000 m, more typically about 100 m to about 2000 m, and even more typically about 200 m to about 1000 m to each other.

The sensing devices may be adapted to transmit and receive information and data from each other or from a third party such as moving vessels operating in the area. According to some embodiments, receiving and transmitting may be performed using a fiber optic or using a network.

Box 903 stands for the communication between the first and second sensing devices in order to exchange information, in particular the position relative to each other, but also further cable parameters, such as temperature, vibration etc., which are described in detail above.

According to embodiments described herein, the position of at least one of the first and second sensing devices with respect to a geographical position sensing module of a wind energy system is determined in 904. The first and/or second sensing device may communicate with the geographical position sensing module of a wind energy system in the same way as the sensing device communicates with other sensing devices.

Typically, the absolute position of the sensing devices, and thus the cable, may then be determined using the position of the geographical position sensing module of the wind energy system and the relative position data transmitted by the sensing devices. According to some embodiments, the position of the geographical position sensing module may be known from settings in the wind energy system. According to other embodiments, the position of the geographical position sensing module may be determined by a suitable method, such as using a GPS module in the geographical position sensing module of the wind energy system.

According to some embodiments, the geographical position sensing module may be arranged at the wind turbine or at a substation of a wind energy system as described above. Typically, the geographical position sensing module may be able to transmit data different from the location data. For instance, the geographical position sensing module may be able to receive and transmit parameters sensed by the sensing modules. According to some embodiments, the geographical position sensing module may transmit the data received from the sensing devices to a control system of the wind energy system.

The above-described systems and methods, that is electrical cables for wind turbines equipped with smart sensors, like the sensing devices described above, facilitate providing information on the location of the cable and assist in predicting the need for maintenance of the cable or eventual cable failure. More specifically, the costs for the smart modules, such as the sensing devices added to the cable as described above, are small compared to the costs for an offshore cable repair and for the down time of a wind energy system during which the position of a broken cable is searched for.

Further, the wind energy system including a cable with sensing devices, the cable with sensing devices, and the method for sensing parameters of a cable as described above enable monitoring of sea cables in order to detect movements of the cable. Further, the features of the described embodiments enable a quick location of the cable. The quick identification of a failure spot allow for reducing the cable repair costs.

Further, with embodiments described herein, it is possible to reduce the risk of high repair costs and especially down times of the wind energy system by preventive maintenance. In the case that the cables described herein (also referred to as "smart cables") are used for condition monitoring the status of the cable and potential threats, repair and maintenance activities can be planned in a way that suits the operation of the wind energy system. For instance, repair and/or exchange measures can be scheduled in the summer when the cable is easy to access and the winds are weak.

The systems and methods described herein also enable an easy detection of the position of a broken cable, such as a submarine cable. In this way, the repair activities can be reduced to a minimum. Time used for detecting the position of the damage and the position of an end of a broken cable can be reduced. For instance, if a ship broke the cable, the position of the two ends can easily be determined and repair can start substantially immediately due to the sensing devices attached to the cable over the whole cable length.

Exemplary embodiments of systems and methods for a wind energy system, including a geographical position sensing module and a cable, a cable for transmitting electrical power from a wind energy system, and a method for sensing parameters of a conducting cable, which is adapted to transmit energy from a wind energy system, are described above in detail. The systems and methods are not limited to the specific embodiments described herein, but rather, components of the systems and/or steps of the methods may be utilized independently and separately from other components and/or steps described herein. For example, any sort of submarine cable can be equipped with the above described sensing devices, and are not limited to practice with only the wind turbine systems as described herein. Rather, the exemplary embodiment can be implemented and utilized in connection with many other rotor blade applications.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose the invention, including the best mode, and also to enable any person skilled in the art to practice the invention, including making and using any devices or systems and performing any incorporated methods. While various specific embodiments have been disclosed in the foregoing, those skilled in the art will recognize that the spirit and scope of the claims allows for equally effective modifications. Especially, mutually non-exclusive features of the embodiments described above may be combined with each other. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A wind energy system comprising:
a geographical position sensing module for determining an absolute position of the geographical position sensing module;
a cable configured to transmit energy from the wind energy system, the cable including:
a first sensing device at a first location of the cable, wherein the first sensing device is configured to determine a relative position of the first sensing device;
a second sensing device at a second location of the cable, wherein the second sensing device is configured to determine a relative position of the second sensing device;
wherein the first sensing device and the second sensing device are configured to communicate with each other;
wherein one of the first sensing device and the second sensing device is configured to communicate with the geographical position sensing module of the wind energy system; and
wherein the wind energy system is configured to determine a cable failure based on data received from the first sensing device and the second sensing device.

2. The wind energy system according to claim 1, wherein the first sensing device and the second sensing device are configured to determine the relative position of themselves to another sensing device.

3. The wind energy system according to claim 1, wherein the first sensing device and the second sensing device are configured to determine the relative position of themselves at a first point of time compared to a position at a second point of time before the first point of time.

4. The wind energy system according to claim 1, wherein the wind energy system is an offshore wind energy system including at least one wind turbine and an offshore substation.

5. The wind energy system according to claim 1, wherein at least one of the first sensing device and the second sensing device is configured to communicate with a third party, which is at a location distant from the cable.

6. The wind energy system according to claim 1, wherein a distance between the first location of the first sensing device and the second location of the second sensing device is from about 100 m to about 2000 m.

7. The wind energy system according to claim 1, wherein the geographical position sensing module of the wind energy system is a global positioning system (GPS) module.

8. The wind energy system according to claim 1, wherein at least one of the first sensing device and the second sensing device is configured to determine a position of the cable under ground.

9. A cable for transmitting electrical power from a wind energy system, comprising:
- a first sensing device at a first location of the cable, wherein the first sensing device is configured to determine a relative position of the first sensing device; and,
- a second sensing device at a second location of the cable, wherein the second sensing device is configured to determine a relative position of the second sensing device;
- wherein the first sensing device and the second sensing device are configured to communicate with each other; and
- wherein one of the first sensing device and second sensing device is configured to communicate with a geographical position sensing module of a wind energy system.

10. The cable according to claim 9, wherein the first sensing device and the second sensing device are configured to determine the relative position of themselves to another sensing device.

11. The cable according to claim 9, wherein the cable is configured to transmit energy from an offshore wind energy system including at least one wind turbine and an offshore substation.

12. The cable according to claim 9, wherein a distance between the first location of the first sensing device and the second location of the second sensing device is from about 100 m to about 2000 m.

13. The cable according to claim 9, wherein at least one of the first sensing device and the second sensing device comprises a magnetic sensor.

14. The cable according to claim 9, wherein at least one of the first sensing device and the second sensing device is at least one of an acceleration sensor, a velocity sensor and a displacement sensor.

15. The cable according to claim 9, wherein the first sensing device and the second sensing device are connected via an optical fiber to each other.

16. A method for supervising a conducting cable configured to transmit energy from a wind energy system, comprising:
- identifying a cable failure by checking parameters sensed by a first sensing device at a first location of the cable and a second sensing device at a second location of the cable;
- determining the relative position of the first sensing device with respect to the second sensing device;
- communicating the position of at least one of the first sensing device and the second sensing device to the respective other one of the first sensing device and the second sensing device; and
- determining the position of at least one of the first sensing device and second sensing device with respect to an absolute position of a geographical position sensing module of a wind energy system.

17. The method according to claim 16, wherein the wind energy system is an offshore wind energy system including at least one wind turbine and an offshore substation.

18. The method according to claim 16, wherein checking parameters comprises at least one of sensing a temperature of the cable, sensing vibrations of the cable, sensing a position underground of the cable, sensing a location of the cable, sensing waves, sensing cable stress, and sensing cable deformation.

19. The method according to claim 16, further comprising calculating the absolute position of at least one of the first sensing device and the second sensing device using the position of the geographical sensing module of the wind energy system and the relative position between the geographical position sensing module and the sensing devices.

20. The method according to claim 16, further comprising locating the first sensing device and the second sensing device at a distance of about 100 m to about 2000 m from each other.

* * * * *